(12) United States Patent
Scholeno et al.

(10) Patent No.: US 10,797,417 B2
(45) Date of Patent: Oct. 6, 2020

(54) HIGH PERFORMANCE STACKED CONNECTOR

(71) Applicant: Amphenol Corporation, Wallingford, CT (US)

(72) Inventors: Michael Scholeno, York, PA (US); Craig W. Clewell, Harrisburg, PA (US)

(73) Assignee: Amphenol Corporation, Wallingford, CT (US)

( * ) Notice: Subject to any disclaimer, the term of this patent is extended or adjusted under 35 U.S.C. 154(b) by 0 days.

(21) Appl. No.: 16/569,729

(22) Filed: Sep. 13, 2019

(65) Prior Publication Data

US 2020/0091637 A1 Mar. 19, 2020

Related U.S. Application Data

(60) Provisional application No. 62/731,034, filed on Sep. 13, 2018.

(51) Int. Cl.
| | |
|---|---|
| *H01R 13/00* | (2006.01) |
| *H01R 12/71* | (2011.01) |
| *H05K 7/20* | (2006.01) |
| *H04B 10/40* | (2013.01) |
| *H05K 7/14* | (2006.01) |

(52) U.S. Cl.
CPC ........... *H01R 12/712* (2013.01); *H04B 10/40* (2013.01); *H05K 7/1427* (2013.01); *H05K 7/20145* (2013.01); *H05K 7/20154* (2013.01); *H05K 7/20172* (2013.01)

(58) Field of Classification Search
CPC .............................. H01R 13/514; G06F 1/20

USPC .................... 439/196, 487, 679.54
See application file for complete search history.

(56) References Cited

U.S. PATENT DOCUMENTS

| | | | |
|---|---|---|---|
| 6,517,382 | B2 | 2/2003 | Flickinger et al. |
| 6,749,448 | B2 | 6/2004 | Bright et al. |
| 6,811,326 | B2 | 11/2004 | Keeble et al. |
| 6,816,376 | B2 | 11/2004 | Bright et al. |

(Continued)

OTHER PUBLICATIONS

[No Author Listed], INF-8438i Specification for QSFP (Quad Small Formfactor Pluggable) Transceiver. Rev 1.0. Nov. 2006. SFF Committee. 75 pages.

(Continued)

*Primary Examiner* — Abdullah A Riyami
*Assistant Examiner* — Nelson R. Burgos-Guntin
(74) *Attorney, Agent, or Firm* — Wolf, Greenfield & Sacks, P.C.

(57) ABSTRACT

A shielded I/O connector that supports high density connections. The shielded connector has a cage with channels. At least a first channel is configured to receive a transceiver such that it may be plugged into a port in a connector housing at an end of the cage. At least a second channel is configured to dissipate heat by enabling air to flow adjacent the transceiver. The rate of air flow in the second channel is increased with a diverter at the end of the second channel to smooth the flow of air through the second channel and out of one or more orifices. The diverter may be simply formed by shaping the housing of a connector at an end of the cage. The orifices may be formed by channel in the connector housing and openings in surfaces of the cage that bound the second channel or the housing channel.

27 Claims, 7 Drawing Sheets

(56) References Cited

U.S. PATENT DOCUMENTS

| | | | |
|---|---|---|---|
| 7,764,504 B2 * | 7/2010 | Phillips | G02B 6/4246 |
| | | | 165/80.2 |
| 8,358,504 B2 * | 1/2013 | McColloch | G02B 6/4269 |
| | | | 361/679.46 |
| 8,469,738 B2 | 6/2013 | Long | |
| 8,830,679 B2 * | 9/2014 | Scholeno | H01R 13/6595 |
| | | | 165/80.2 |
| 9,389,368 B1 | 7/2016 | Sharf | |
| 9,509,102 B2 | 11/2016 | Sharf et al. | |
| 9,653,829 B2 | 5/2017 | Long | |
| 9,668,378 B2 * | 5/2017 | Phillips | H01R 24/60 |
| 9,761,974 B2 | 9/2017 | L'Esperance et al. | |
| 10,153,571 B2 | 12/2018 | Kachlic | |
| 10,367,283 B2 | 7/2019 | L'Esperance et al. | |
| 10,446,960 B2 * | 10/2019 | Guy Ritter | H01R 13/6594 |
| 10,511,118 B2 * | 12/2019 | Beltran | H01R 13/514 |
| 10,551,580 B2 | 2/2020 | Regnier et al. | |
| 10,555,437 B2 * | 2/2020 | Little | G02B 6/428 |
| 10,588,243 B2 * | 3/2020 | Little | H05K 9/0024 |
| 2012/0003848 A1 | 1/2012 | Casher et al. | |
| 2012/0202370 A1 * | 8/2012 | Mulfinger | H01R 12/737 |
| | | | 439/329 |
| 2013/0012038 A1 * | 1/2013 | Kirk | H01R 12/721 |
| | | | 439/55 |
| 2013/0164970 A1 * | 6/2013 | Regnier | H05K 7/20509 |
| | | | 439/487 |
| 2014/0154912 A1 * | 6/2014 | Hirschy | H01R 13/46 |
| | | | 439/487 |
| 2015/0132990 A1 * | 5/2015 | Nong Chou | G02B 6/4257 |
| | | | 439/487 |
| 2015/0280368 A1 * | 10/2015 | Bucher | G02B 6/4269 |
| | | | 439/487 |
| 2016/0211623 A1 * | 7/2016 | Sharf | G02B 6/4269 |
| 2017/0054234 A1 * | 2/2017 | Kachlic | H01R 13/6594 |
| 2017/0285282 A1 | 10/2017 | Regnier et al. | |
| 2019/0115677 A1 | 4/2019 | Kachlic | |
| 2019/0181582 A1 * | 6/2019 | Beltran | H05K 3/00 |

OTHER PUBLICATIONS

[No Author Listed], INF-8628 Specification for QSFP-DD 8X Transceiver (QSFP Double Density) Rev 0.0. Jun. 27, 2016. SNIA SFF TWG Technology Affiliate. 1 page.

[No Author Listed], SFF-8663 Specification for QSFP+ 28 Gb/s Cage (Style A) Rev 1.7. Oct. 19, 2017. SNIA SFF TWG Technology Affiliate. 18 pages.

Chen et al., High Performance Electrical Connector, High Density Electrical Interconnection., U.S. Appl. No. 16/663,189, filed Oct. 24, 2019.

Scholeno et al., High Performance Stacked Connector, U.S. Appl. No. 16/824,355, filed Mar. 19, 2020.

\* cited by examiner

HIGH PERFORMANCE STACKED CONNECTOR

CROSS-REFERENCE TO RELATED APPLICATIONS

This application claims priority to and the benefit under 35 U.S.C. § 119(e) of U.S. Provisional Patent Application Ser. No. 62/731,034, filed on Sep. 13, 2018, entitled "HIGH PERFORMANCE STACKED CONNECTOR," which is hereby incorporated herein by reference in its entirety.

BACKGROUND

An electronic system may include two or more electronic devices connected with a cable. The devices may have input/output (I/O) connectors for connecting with plug connectors terminating the ends of the cable. The cable may be constructed to carry electrical or optical signals. For transmitting optical signals, a transceiver is provided at one end of the cable for converting the optical signals to electrical signals.

The plugs and I/O connectors may be constructed according to standards that enable components from different manufacturers to mate. For example, the Quad Small Formfactor Pluggable (QSFP) standard defines a compact, hotpluggable transceiver used for data communications applications. The form factor and electrical interface are specified by a multi-source agreement (MSA) under the auspices of the Small Form Factor (SFF) Committee. Components made according to the QSFP standard are widely used to interface networking hardware (such as servers and switches) to fiber optic cables or active or passive electrical connections.

A QSFP plug mates with a receptacle, which is typically mounted on a printed circuit board (PCB). To block electromagnetic interference (EMI), the receptacle may be located within a metal cage also mounted to the PCB. The receptacle is typically set back from the edge of the PCB and located at the back portion of the cage. The front portion of the cage usually extends through a panel of an electronic device and has an opening for receiving the QSFP transceiver. A channel extends from the opening at the front portion of the cage toward the rear portion to guide the transceiver into engagement with the receptacle. Such an arrangement may be used to connect a circuit board inside an electronic device to an external device using a cable.

A transceiver for converting optical signals to electrical signals may consume a lot of power, and therefore generate a lot of heat. A QSFP transceiver might consume 12 Watts (W) of power, for example. Transceivers that process more signals, such as transceivers made according to a QSFP-DD standard, may consume up to 15 W. Large amounts of heat may cause the temperature around electronic, optical, or other components to exceed the rated operating temperature, contributing to errors during operation or reducing the lifetime of the components. Heat generated by a transceiver may be dissipated through the use a cooling fan that flows air over the metal cage. Heat sinks may be mounted to the outside of the cage to further dissipate heat from the transceiver.

In some systems, two or more transceivers are disposed in close proximity to each other. I/O connectors may be configured in a "stacked" configuration to support use of multiple transceivers. For example, an upper transceiver and lower transceiver stacked within one cage to make a double stacked connector.

SUMMARY

In one aspect, the invention relates to an I/O connector. The I/O connector comprises a plurality of conductive elements which comprise mating contact portions and a housing. The housing comprises a first port comprising a first slot extending into the housing in a first direction and elongated in a second direction. The first slot is bounded by opposing first and second walls extending in the first direction. Mating contact portions of a first portion of the plurality of conductive elements are exposed within the first slot. The housing comprises a second port comprising a second slot extending into the housing in the first direction and elongated in the second direction. The second slot is bounded by opposing first and second walls extending in the first direction. Mating contact portions of a second portion of the plurality of conductive elements are exposed within the second slot. The housing comprises a surface between the first port and the second port. The surface forms an obtuse angle with respect to the first direction.

In another aspect, the invention relates to an apparatus. The apparatus comprises a cage. The cage comprises opposing conductive sidewalls and a top wall between the opposing sidewalls, a first channel comprising a first opening configured to receive a transceiver, a second channel adjacent the first channel, the second channel comprising at least one second opening configured to enable air to flow into the second channel, and a connector comprising a port aligned with the first channel. The connector comprises a housing. The first channel extends in a first direction from the first opening to the port of the connector. The second channel extends in the first direction. The housing comprises a diverter aligned with the second channel. The diverter is configured to divert air flowing in the first direction towards at least one sidewall of the cage.

In another aspect, the invention relates to an electronic system. The electronic system comprises an enclosure having a panel with at least one opening therethrough, a printed circuit board within the enclosure, a cage mounted to the printed circuit board, and at least one fan positioned to cause air to flow over the cage. The cage comprises a first channel, a second channel and a third channel having ends exposed in the opening. The second channel is between the first channel and the third channel. The second channel is elongated along a first direction. A first end of the second channel comprises at least one opening configured to allow air to flow therethrough. The second channel comprises a second end, offset from the first end in the first direction. The electronic system further comprises a diverter disposed at the second end of the second channel, the diverter comprising a first surface not normal to the first direction.

In another aspect, the invention relates to a method of operating an electronic system in an ambient environment of 25 degrees C. The electronic system comprises, within an enclosure, a stacked cage comprising a plurality of walls configured to form stacked first, second and third channels, the second channel extending in a first direction, and a diverter. The method comprises transmitting or receiving optical signals with a transceiver disposed within each of the first and third channels consuming between 10 and 12 W, flowing air through an opening at a first end of the second channel with a fan operating at a static pressure between 0.8 and 1.5 IW, and diverting the air with a first surface of the diverter, towards openings in walls of the cage, thereby dissipating heat from the transceivers in the first and third channels such that a temperature rise of both transceivers relative to an off state of the transceivers is less than 25 degrees C.

The foregoing is a non-limiting summary of the invention, which is defined by the appended claims.

DETAILED DESCRIPTION

Figure 1:
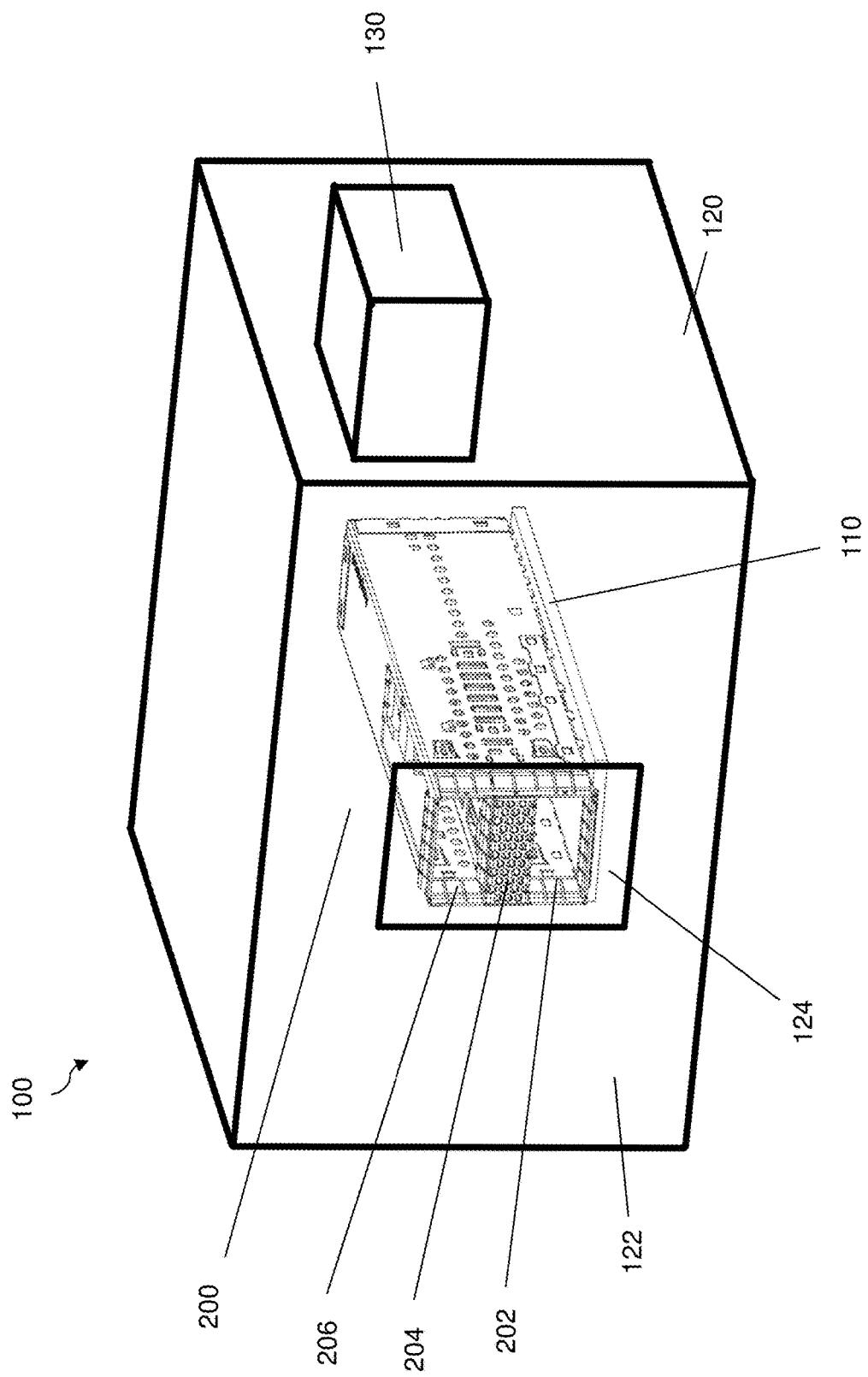
FIG. 1 is a front-right perspective view of an electronic connection system according to some embodiments.

The inventors have recognized and appreciated designs that enable an increased density of I/O connections. The inventors have recognized and appreciated that an increased density of I/O connections may require improved heat dissipation from I/O connectors. Increased density may arise from transceivers that process more signals in the same space as conventional transceivers, such as may arise in transceivers compliant with the QSFP-DD standard rather than a QSFP standard. Additionally, increased density may result from "stacking" connectors, which results in transceivers one above the other with only a small space between them. The inventors have further recognized and appreciated techniques to provide improved heat dissipation even for stacked connectors. These techniques may be used in connection with components compliant with QSFP standards.

Those techniques may increase the volumetric flow rate of air that flows through a channel of a cage, without a need to increase the size of a fan causing that flow. In accordance with some embodiments, the channel may be bordered by features that promote airflow. Such features may include a diverter at an end of the channel that smooths the flow of air towards an exit. Operation of a system with such a diverter may entail flowing air towards the diverter and diverting the air flow.

In accordance with some embodiments, the diverter may be implemented simply and at low cost. The diverter may be part of a housing for a connector. The diverter may include one, two or more surfaces, each of which makes an obtuse angle with the air flow. However, the diverter may also include one or more other surfaces which have other orientations with respect to the airflow, such as one or more surfaces that are normal to the flow. The surfaces of the housing forming the diverter may be aligned with a rear end of a channel in the cage and divert the air towards openings in surfaces of the cage or towards other orifices through which the air may more freely flow out of the channel of the cage. The configuration of the diverter may decrease stagnation and/or separation of flow in the channel, which may increase the volumetric flow rate of air through the channel.

In some embodiments, the diverter may be disposed at the end of a channel of the cage. That channel may be disposed between two other channels which are configured to receive transceivers, such as may occur in a stacked I/O connector.

The orifices through which air flows out of the cage may be formed in any suitable way, including by forming openings in surfaces of the cage and or by openings in the housing or by shaping exterior surfaces of the connector housing that are adjacent interior surfaces of the cage.

In some embodiments, for example, such orifices may be formed by the shape of the housing. The housing may include a housing channel along the air flow direction, and air flow may be directed into the housing channel. Alternatively or additionally, the diverter may direct air towards or through holes in one or more surfaces of the cage bounding the channel, or holes in one or more surfaces of the cage along the housing channel.

In a stacked connector, for example, there may be a cage for electrical connectors that includes a first, second, and third channel where the second channel is between the first and third channel. In such a configuration, the connector and cage may provide a double stacked configuration, providing an I/O connector that can receive two transceivers, one above the other. The first channel and third channel may each be capable of receiving an optical or other type of transceiver. The transceiver may be a QSFP transceiver, such as a QSFP-DD transceiver. In this regard, the first channel and/or the third channel may be compliant with QSFP standards. A heat sink may be mounted on the top of the third channel to dissipate heat from a transceiver, but a heat sink mounted to the top of the third channel may not dissipate heat effectively from the first channel. The second channel may be used to increase heat dissipated from the first channel. Air may be flowed through an opening in the second channel, and diverted at the end of the second channel so as to increase the airflow rate and therefore increase heat dissipation.

In an electronic system, the diverter may allow heat to be dissipated more effectively than a configuration without a diverter, particularly for electronic systems which include double stacked transceivers.

In one illustrative embodiment shown in FIG. 1, an electronic system 100 may include an enclosure 120, the enclosure including a panel 122 with at least one opening 124 therethrough. The electronic system 100 may also include a printed circuit board 110 within the enclosure 120. The electronic system 100 may also include a cage 200. The cage 200 may be mounted to the printed circuit board 110 and may enclose a connector with a housing 400 having first port 420 and second port 430 (FIG. 3) mounted to the printed circuit board 110. The electronic system 100 may also include a fan 130.

In some embodiments, the cage 200 may be configured to provide shielding from electromagnetic interference. The cage 200 may be formed from any suitable metal or other conductive material and connected to ground for shielding against EMI using techniques known to one of skill in the art. The cage 200 may be formed from sheet metal bent into a suitable shape. However, some or all of the components of the cage may be made of other materials, such as die cast metal.

Figure 2:
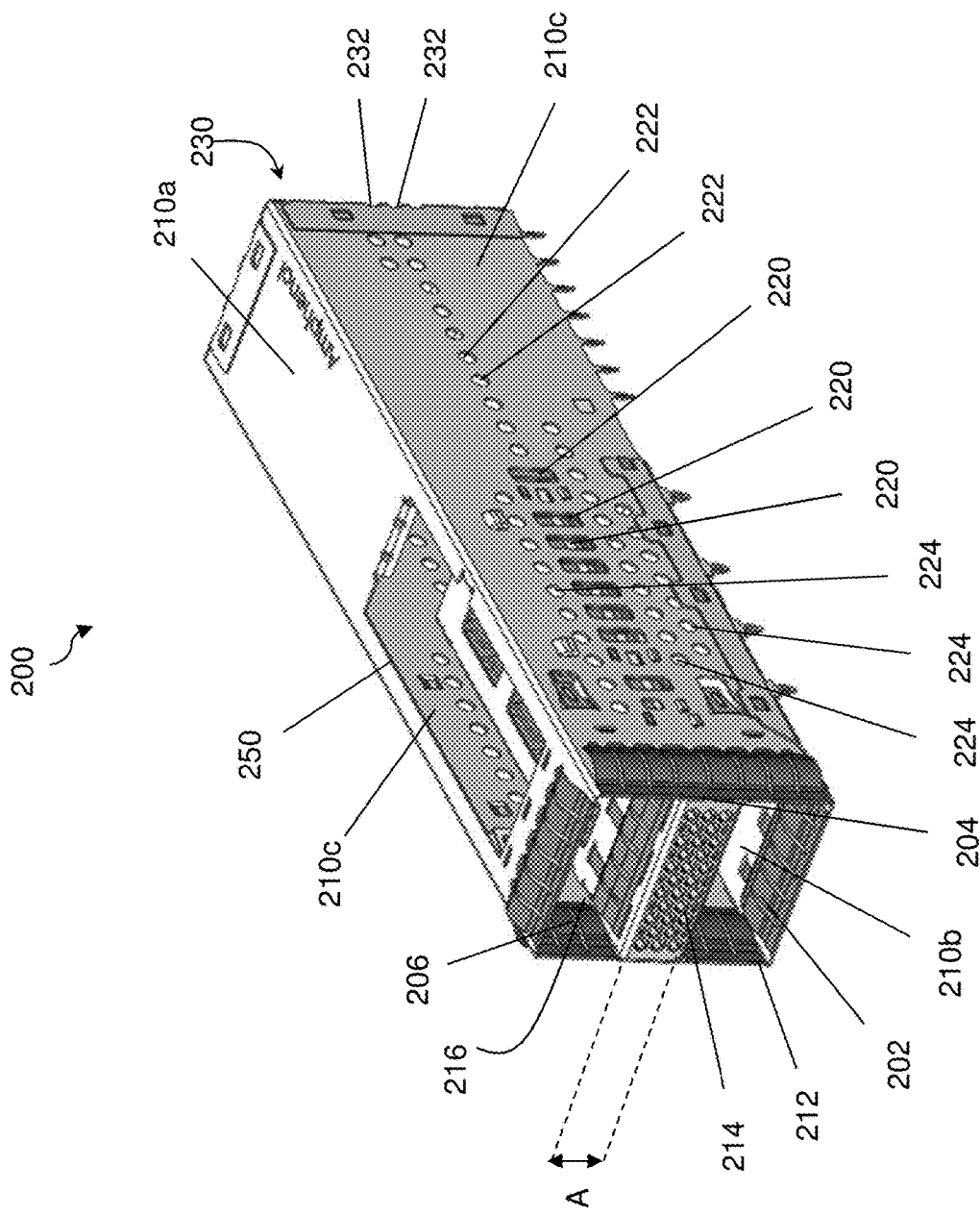
FIG. 2 is a front-right perspective view of a cage for an electrical connector according to some embodiments of a cage adapted to receive a heat sink.

The cage 200 may include a connector with multiple ports. In the illustrated embodiment of FIG. 3, the connector is a dual port connector with a first port 420 and a second port 430. However, techniques as described herein may be used with connectors of any desired number of ports, including a single port or more than two ports. The cage 200 may include one or more channels, sized and shaped to receive a transceiver that will plug into a connector port positioned at an end of the channel. The cage 200 may also include one or more channels configured to enable air to flow adjacent a channel receiving a transceiver such that heat generated by operation of the transceiver may be dissipated. As shown in FIG. 2, the cage 200 may include a first channel 202, a second channel 204 and a third channel 206.

The first channel 202 may include an opening 212 configured to receive a transceiver. The first port 420 may be aligned with first channel 202. According to some embodiments, the first channel 202 may be configured to receive and/or guide a transceiver to connect to a port 420 in order to establish connections between the transceiver and the port 420, which in the embodiments illustrated are electrical connections. The first channel 202 may extend in a first direction from the first opening to the first port 420. The first direction may be aligned with the flow of air through the second channel 204. In the illustrated embodiment of FIG. 1, opening 212 of the first channel 202 is exposed in opening 124 of the enclosure 120.

The cage 200 may include a second channel 204. The second channel 204 may include an opening 214 which may be configured to enable air to flow into the second channel 204. The opening 214 may be disposed at a first end of the second channel 204. The diverter 410 may be disposed at a second end of the second channel 204. The second channel 204 may be elongated in the first direction and air flowing through the second channel may carry away heat generated by components in the first and/or third channels, limiting the temperature rise within the cage 200. The diverter may be shaped and positioned to improve the efficiency with which heat is removed and consequently to limit the temperature rise within cage 200. In the illustrated embodiment of FIG. 1, opening 214 of the second channel 204 is also exposed in opening 124 of the enclosure 120. Opening 214 may be created as a plurality of holes disposed at the first end of the second channel 204, or any other suitable arrangement that allows air to flow into the second channel. The opening 214 may be configured such that the amount of electromagnetic radiation that passes through the opening does not interfere with the function of the cage to limit EMI.

In various embodiments, the second channel may have a length greater than 40 millimeters (mm), less than 60 mm, or in some embodiments, between 40 and 60 mm. In some embodiments, the length of the second channel may be between 49 and 51 mm, for example, 50 mm.

The cage 200 may include a third channel 206. The third channel 206 may include an opening 216 configured to receive a transceiver. The second port 430 may be aligned with the third channel 206. According to some embodiments, the third channel 206 may be configured to receive and/or guide a transceiver to connect to a port 430 in order to establish connections between the transceiver and the port 430, which in the embodiments illustrated are electrical connections. In the illustrated embodiment of FIG. 1, end 216 of the third channel 206 is also exposed in the opening 124 of the enclosure 120. In the embodiment illustrated, the second channel 204 is between the first channel 202 and the third channel 206. The first channel 202 may be adjacent the printed circuit board 110.

Each channel may have a suitable width, such as greater than 18 mm, less than 20 mm, or, in some embodiments, between 18 and 20 mm. Channel width may be between 18.65 and 18.85 mm, for example, 18.75 mm. The width of each channel may be configured equal to or greater than the width of a QSFP transceiver such that the first channel 202 and third channel 206 may each be configured to receive a QSFP transceiver.

For some applications, the first port 420 and second port 430, transceivers, and other elements of the interconnection system may be configured in accordance with one or more Small Form Factor (SFF) standards, such as QSFP or QSFP-DD. However, it is to be understood that the components of the electronic connection system may configured to be compliant with one or more other industry standards or no standards at all, if desired.

The cage 200 may be bounded by conductive top wall 210a, conductive bottom wall 210b (not visible in FIG. 2), and conductive side walls 210c. The cage 200 may include opposing conductive sidewalls 210c (one of which is visible in FIG. 2) with a top wall 210a between the opposing sidewalls. The bottom wall 210b may serve as the bottom wall of first channel 202. Top wall 210a may serve as the top wall for the third channel 206. Partitions 210d internal to cage 200 may form the top and bottom walls of second channel 204. One or more wall pieces may combine to provide shielding. In some embodiments, the internal partitions 210d may have openings 211d, which may allow heat from a transceiver installed in the first or third channel to flow into the second channel. The first channel 202 may be separate from the third channel 206 by a distance A. In some embodiments, the distance A may be 8 mm or less. In some embodiments, the distance A is measured not including the internal partitions 210d forming the second channel; in these embodiments distance A may be 5.98 mm. In some embodiments, the distance A is measured including the internal partitions 210d forming the second channel; in these embodiments distance A may be 6.48 mm. The second channel 204 may be adjacent the first channel 202.

Figure 3:
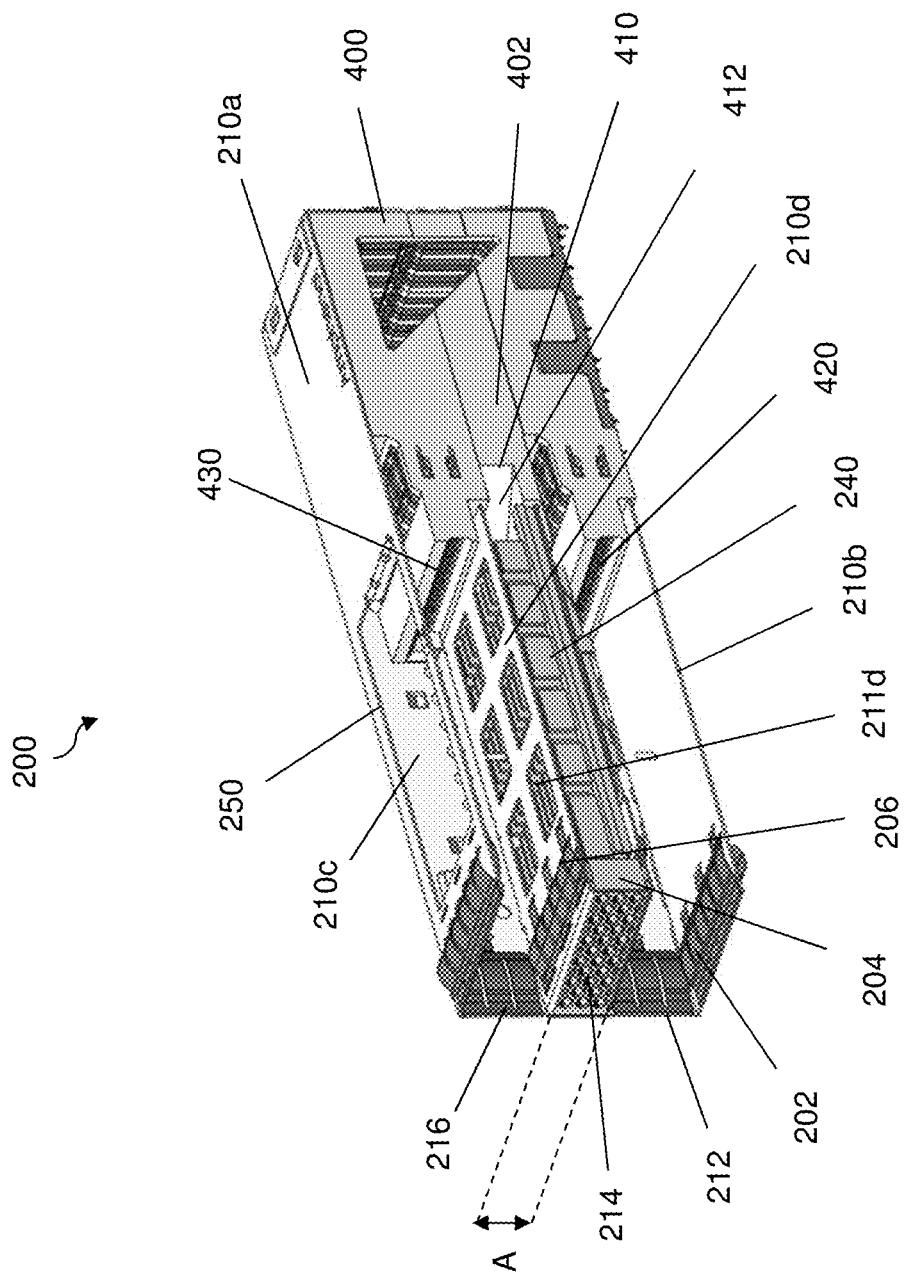
FIG. 3 is a front-right perspective cutaway view of a cage for an electrical connector according to some embodiments.
Figure 6:
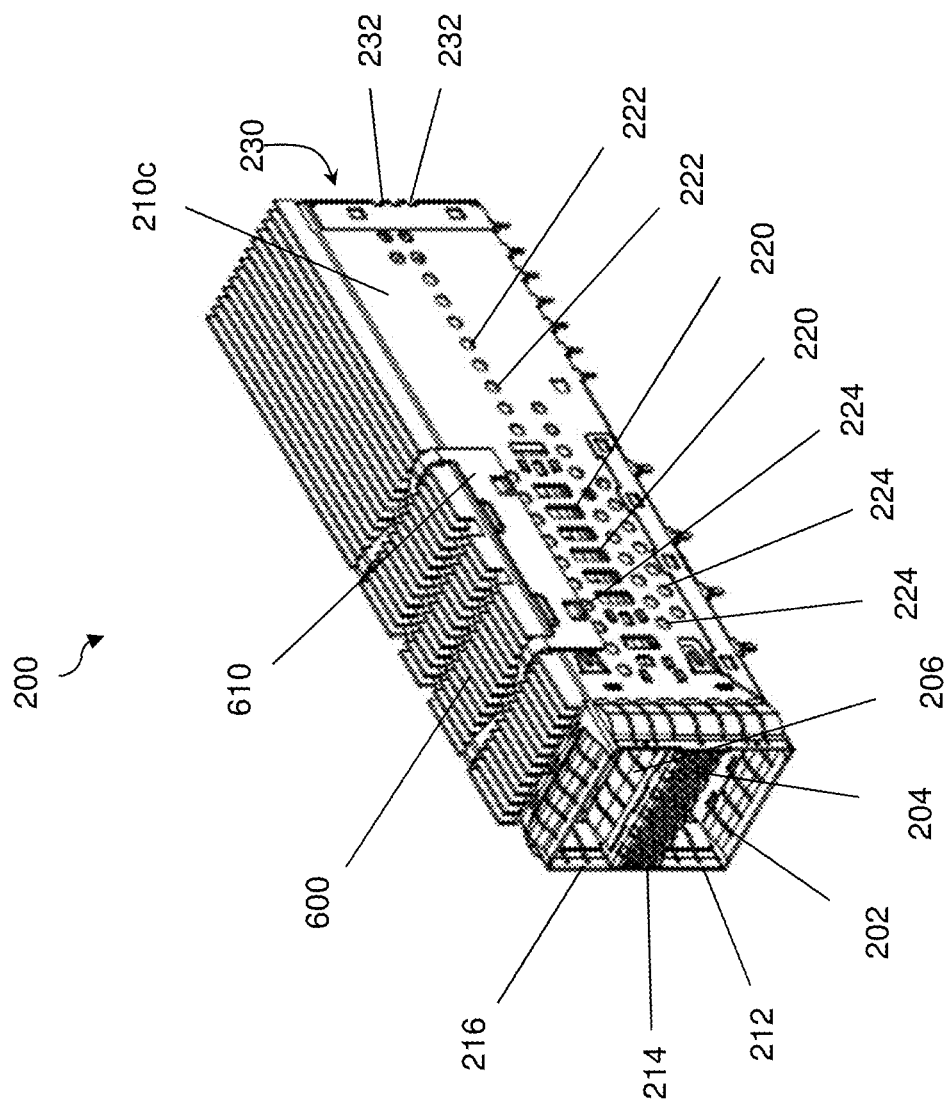
FIG. 6 is a front-right perspective view of a cage for an electrical connector according to some embodiments of a cage with a heat sink.

In the embodiment illustrated in FIGS. 2 and 3, the top wall 210a may include an opening 250 therein. That opening 250 may enable a heat sink 600 mounted to a top surface of the cage 200 to contact a transceiver installed within the third channel 206. A heat sink 600 may be mounted to the top surface of the cage 200 using a clip 610. FIG. 6 shows an embodiment in which a heat sink 600 contributes to shielding. Such a heat sink 600 is optional. FIGS. 2 and 3 show an opening 250 in the top wall of the third channel 206 to enable a heat sink 600 to contact a transceiver in the third channel. Some embodiments may have a cage without such an opening, including, for example, embodiments in which a heat sink is not desired. FIG. 6 shows a perspective view of how a heat sink 600 may be mounted to the top surface of a cage 200 having an opening 250 using clip 610. According to an embodiment, air may be flowed over such a heat sink 600 mounted outside the cage 200.

Figure 4:
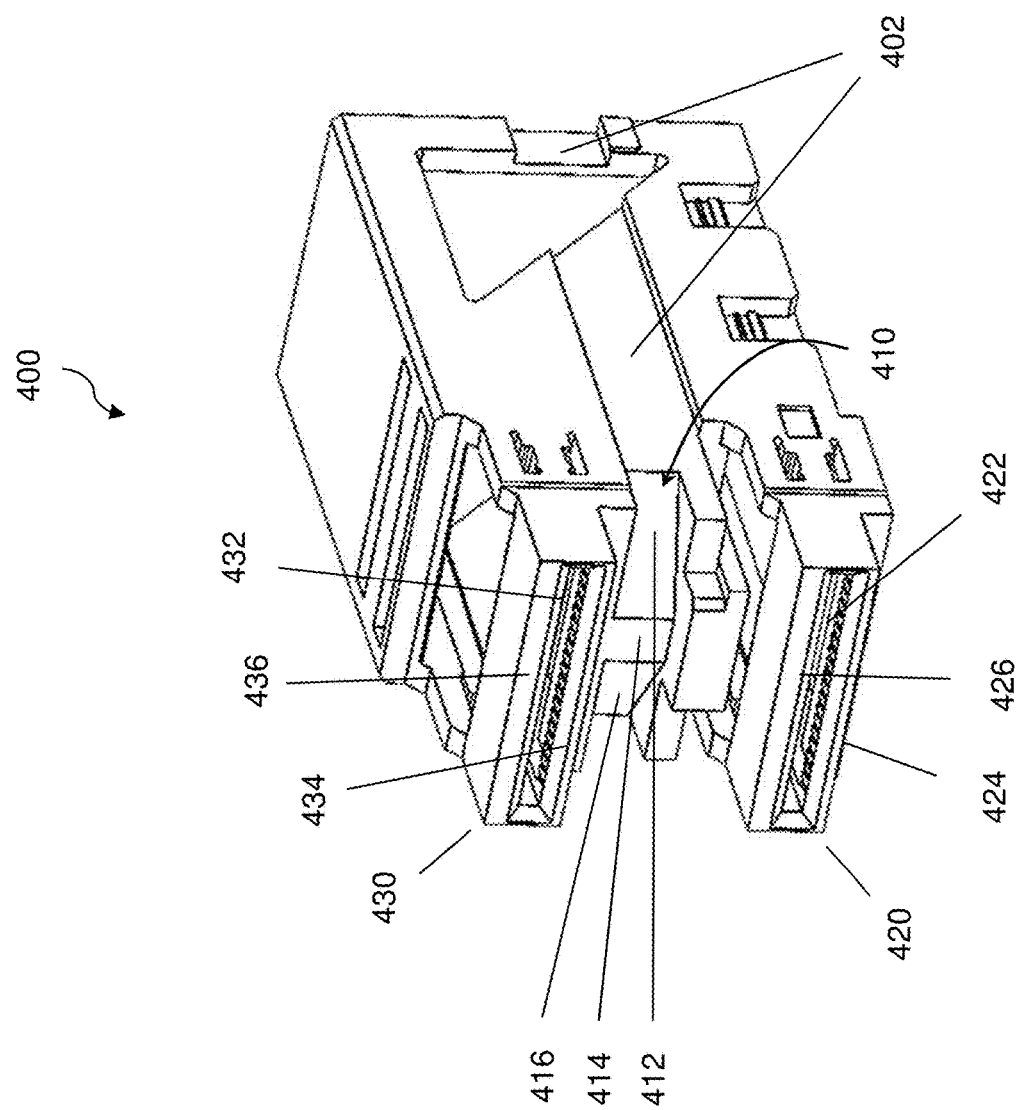
FIG. 4 is a front-right perspective view of a housing for an electrical connector according to some embodiments.

An example embodiment of a housing 400 for a connector is shown in FIG. 4. An I/O connector may be formed from such a housing 400. The housing 400 may be disposed within a cage 200, as shown in FIG. 3, or may be disposed at the end of a cage 200 or the end of a channel, or may be provided without either a cage or a channel. It should be appreciated that the diverter 410 may be placed in any suitable location which allows it to direct air in a way that increases the volumetric flow rate of air through a cage or channel, or which increases the volumetric flow rate of air past the housing 400 or diverter 410.

Housing 400 may hold a conductive elements that couple signals from a printed circuit board, or other substrate to which an I/O connector formed from housing 400 is mounted, to a plug inserted into a channel of the cage. That plug may be a mating interface of a transceiver.

Figure 5:
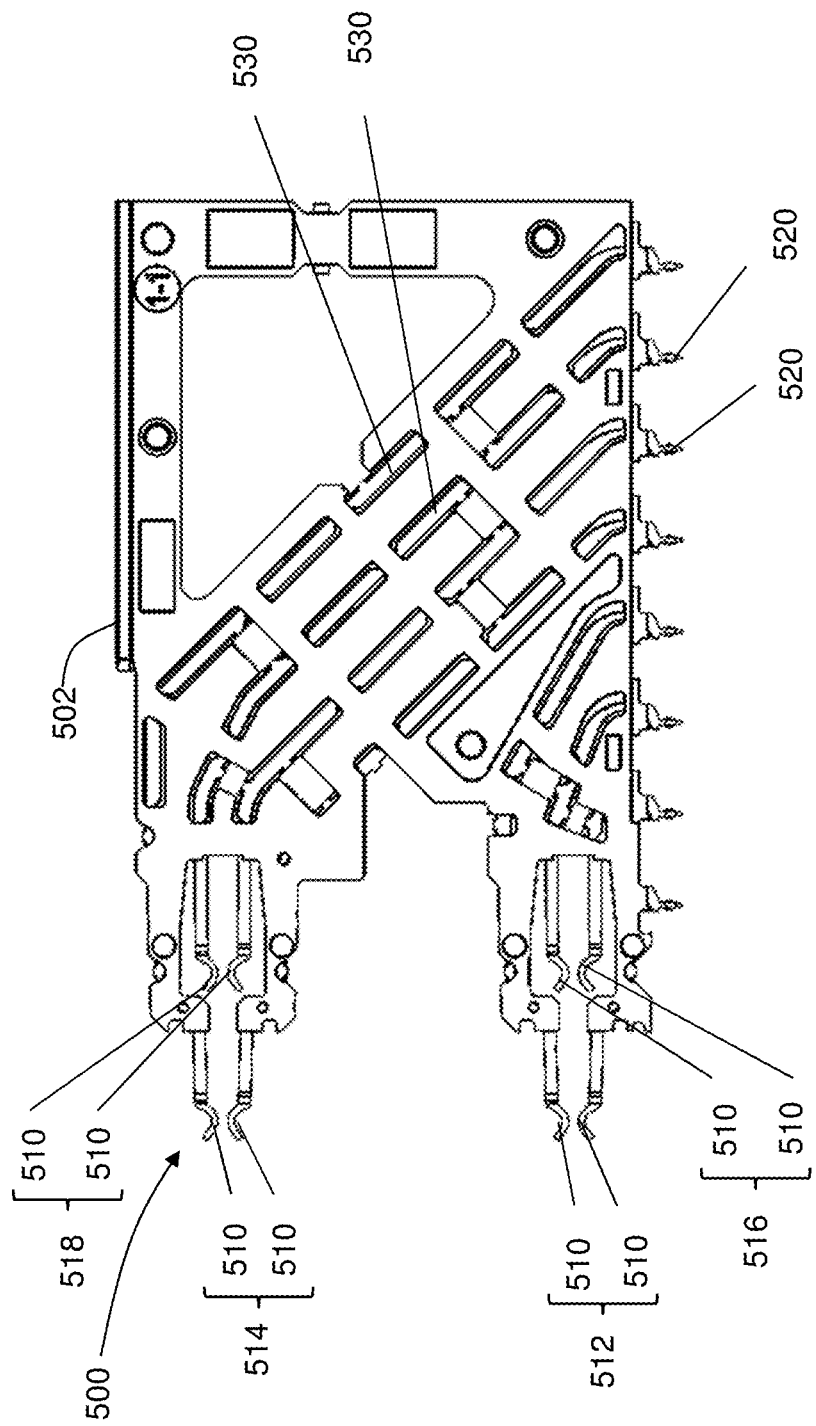
FIG. 5 is right side view of a subassembly of conductive elements according to some embodiments.

In the embodiment illustrated, subsets of the conductive elements are first formed into subassemblies, which are then inserted into housing 400. FIG. 5 illustrates such a subassembly. The subassembly of FIG. 5 may be formed by stamping the subset with a plurality of conductive elements 500 from a sheet of metal. Insulative material may then be molded around portions of the conductive elements to form a housing 502. Multiple such subassemblies may be stacked side-by-side and inserted into housing 400. In the illustrated embodiment, each subassembly may be substantially thinner than it is wide or tall. Each subassembly may be, for example, on the order of 1.5-3 mm thick, such that the subassemblies have a wafer-like aspect ratio, and may be called a "wafer."

The conductive elements 500 including mating contact portions 510, contact tails 520 configured to mate with a circuit board 110 and intermediate portions 530 connecting the contact tail portions 520 to the mating portions 510. The plurality of conductive elements 500 may be configured to transmit electrical signals to or from transceivers disposed in the first and/or third channels to the circuit board 110, or to other components which are electrically coupled to the circuit board.

In the illustrated embodiment, which is a double stacked connector, the housing includes a first port 420 having a first slot 422 extending into the housing 400. The first slot 422 may extend into the housing 400 along the first direction—the direction in which a plug will be inserted into a channel—and may be elongated in a second direction that is orthogonal to the first direction. The first slot 422 may be bounded by opposing first and second walls 424 and 426, each with channels extending in the first direction. The mating contact portions 510 of a first portion of the plurality of conductive elements 500 may be positioned within the channels such that they are exposed within the first slot 422. The first slot 422 may be configured to accept an optical transceiver or other conductive elements electrically coupled to an optical transceiver. In some embodiments, the mating contact portions may be positioned within the first slot 422 in accordance with a standard, such as QSFP or, in the illustrated embodiment, QSFP-DD.

The housing may include a second port 430 having a second slot 432 extending into the housing 400. The second slot 432 may extend into the housing along the first direction and may be elongated in the second direction. The second slot 432 may be bounded by opposing first and second walls 434 and 436, each extending in the first direction. The mating contact portions 510 of a second portion of the plurality of conductive elements 500 may be exposed within the second slot 432. The first slot 422 may be configured to accept an optical transceiver or other conductive elements electrically coupled to an optical transceiver.

The first and second slots 422 and 432 may be spaced from each other in a third direction that is perpendicular to both the first and second direction. In this manner, the ports may be arranged to provide a stacked connector. When an I/O connector incorporating housing 400 is attached to a printed circuit board, such as circuit board 110, the third direction may be perpendicular to a surface of that printed circuit board. In the illustrated embodiment, contact tail portions 520 are press fit contact tails and extend in the third direction such that they may be pressed into holes in the surface of the printed circuit board.

The mating contact portions 510 of the plurality of conductive elements 500 may be arranged in pairs. At least a first pair 512 of mating contact portions 510 may be disposed in the first slot 422. At least a second pair 514 of mating contact portions 510 may be disposed in the second slot 432. Here, the pairs are arranged with contact surfaces on mating contact portions 510 facing each other. The mating contact portions of each pair will be positioned on opposite sides of a slot 422 or 432 such that they will mate on opposite sides of a component, such as a paddle card of a transceiver, inserted into the slot.

The connector may also include a third pair 516 of mating contact portions 510 disposed in the first slot 422 and spaced apart from the first pair 512 along the first direction. The connector may also include a fourth pair 518 of mating contact portions 510 disposed in the second slot 432 and spaced apart from the second pair 514 along the first direction. The first pair 512 and second pair 514 may be outer pairs, which may be positioned to make contact with conductive pads on a paddle card of either a QSFP or a QSDP-DD transceiver. The third pair 516 and fourth pair 518 may be inner pairs, which may be configured to make contact with conductive pads on a paddle card of a QSFP-DD transceiver. In the embodiment illustrated, the inner and outer pairs are separated by insulative portions of the subassembly such that they will not come into electrical contact with each other, even when deflected by a mating connector inserted into one of the ports.

In embodiments in which subsets of the conductive elements are formed into wafers, the wafers may be arranged in planes aligned with the first and third directions. The wafers may be stacked in the second direction, which is the direction in which the slots 422 and 432 are elongated. All of the wafers may have the same configuration or may, in some embodiments, have different configurations. The wafers may be disposed within or supported by the housing 400. At least one of the first port 420 and second port 430 may be configured to receive QSFP and/or QSFP-DD transceivers. Accordingly, the I/O connector may be compliant with QSFP standards. However, it is to be understood that the components of the electronic connection system may configured to be compliant with one or more other industry standards or no standards at all, if desired.

When an I/O connector is designed to be compliant with a standard, the standard may define the function of each of the conductive elements. In other embodiments, the conductive elements may be connected to any desired portions of an electronic system such that they serve any desired function. Some conductive elements, for example, may be connected to ground. Others of the conductive elements may be coupled to signal traces within the system. In embodiments in which the electronic system operates using differential signals, pairs of conductive elements may be connected to pairs of signal traces. In some embodiments, the pairs 512, 514, 516 and 518 may be connected such that each pair carries a differential pair of signals. However, it is not a requirement that the pairs as identified herein carry differential signals. In some embodiments, for example, conductive elements in two adjacent wafers may be configured to carry a differential signal.

Regardless of specifically how the conductive elements are connected to other components of the electronic systems, those components may generate heat in operation. When the components are positioned within the cage 200, that heat, if not removed from cage 200 may create a temperature rise inside cage 200 that exceeds a desired operating temperature. To improve the efficiency with which heat is removed and prevent an undesired temperature rise, housing 400 may include a diverter 410 that has one or more angled surfaces that smooth air flowing through a cage continuing housing 400 toward at least one orifice through which flowing air can leave the cage. In the embodiment illustrated, diverter 410 may be configured to divert air flowing along the first direction towards at least one sidewall of the cage. The diverted air may exit the cage, such as through holes in the sidewall or through a channel that routes the airflow around housing 400.

Housing 400 may be shaped such that, when housing 400 is installed within cage 200, diverter 410 is aligned with the second channel 204, which, in the embodiment described above is designed to carry an air flow in a first direction to dissipate heat from transceivers within the first and third channels. Diverter 410 may be disposed at a second end of the second channel 204, the second end of the second channel being offset in the first direction from the first end of the second channel. The diverter 410 may include a first surface 412 which forms an obtuse angle with respect to the first direction.

The diverter 410 may also include a second surface 416 which forms an obtuse angle with the first direction. The first surface 412 and the second surface 416 may converge toward a plane extending in the first direction and bisecting a central portion of the housing 400.

The diverter 410 may include a third surface 414 which is normal to the first direction, and which may be between the first surface 412 and second surface 416. The third surface 414 may join the first and second surfaces.

In the embodiment illustrated, the first surface 412 and second surface 416 make the same obtuse angle with respect to the first direction. In some embodiments, the angle may be measured about the third direction (which is the direction perpendicular to the circuit board). However, it is not a requirement that those surfaces be symmetrical with respect to the air flow direction. The surfaces, for example, may be oriented at different angles, have different sizes or differ in other desired ways. Moreover, though the diverter is shown with three surfaces 412, 414, and 416, three surfaces is not a requirement, as the diverter could be formed with one or two surfaces or more than three surfaces.

The obtuse angles of the first surface 412 and second surface 416 may be selected to provide airflow as desired. In some embodiments, each obtuse angle may be greater than 95 degrees, or 105 degrees or greater than 115 degrees. In some embodiments, the obtuse angles may be less than 165 degrees, 150 degrees, 140 degrees, or 130 degrees. In some embodiments the obtuse angle may be in a range between 105 and 150 degrees. In other embodiments, the obtuse angles may be between 115 and 140 degrees, for example 120 degrees. In embodiments in which only a first surface 412 or only a first surface 412 and a third surface 416 are used, the angle may exceed 90 degrees by half the amount given in the foregoing examples.

The first, second, and/or third surfaces may be disposed between the first port 420 and the second port 430. In some embodiments, the first port 420 and the second port 430 may extend further outwards (in a direction opposite the first direction) than the first, second, and/or third surfaces. In some embodiments, the first, second, and/or third surfaces may be inset from the first port 420 and second port 430 in the first direction.

In some embodiments, the first, second, and third surfaces may include faces. In some embodiments, the first, second, and third surfaces may each include flat faces. In some embodiments, the first, second, and third surfaces may each include concave faces. In some embodiments the first, second, and third surfaces may each include convex faces. In some embodiments, the first, second, and third surfaces may each include one or more faces, which may be faces of different curvatures.

Housing 400 may include other features that facilitate airflow. The housing 400 may include a housing channel 402. The housing channel 402 may be configured to allow air to flow past the housing 400. In the embodiment illustrated, housing channel 402 extends only in the first direction, and it extends to the rearward edge of housing 400. Cage 200 may be configured with an opening at the rearward edge of channel 402, such that airflow may exit the cage at that location. Cage 200 may alternatively or additionally have openings at other locations along housing channel 402 which may similarly allow airflow to exit the cage.

Housing channel 402 may be adjacent the first surface 412 of the diverter 410. The first surface 412 of the diverter may be configured to direct air towards or through the housing channel 402. In some embodiments, an opposite side (not visible in FIG. 4) of housing 400 may similarly include a housing channel 402. The second housing channel may be shaped and positioned to receive airflow diverted by second surface 416.

According to some embodiments, the second channel 204 may be bounded by a surface of cage 200. The surface may comprise a sidewall 210c, as shown in FIG. 2. In some embodiments, there is one or more first holes 220 through the surface. The first holes 220 may be arranged along the second channel 204 in a line extending in the first direction. The first holes 220 are not limited to an arrangement along a line, and may be arranged in a plurality of lines or any other arrangement which promotes flow of air through the cage 200. In the embodiment illustrated, holes 220 promote flow through second channel 204. The first holes 220 may allow air drawn in through the opening 214 in the second channel 204 to exit the second channel 204.

At least one first hole 220 may be arranged adjacent to the diverter 410. The configuration of the diverter 410 may allow more first holes 220 to be arranged along the second channel 204 than in a case where there is a configuration with no diverter. Alternatively or additionally, diverter 410 may be configured to direct air towards or through at least one of the first holes 220, increasing the airflow through the second channel relative to a system with the same size fan and system configuration.

According to some embodiments, the cage 200 includes a back cover 230, a portion of which is visible in FIG. 2. The back cover 230 may be formed as a separate part than other walls of cage 200 or may be formed from the same sheet of metal as the cage. There may be at least one second hole 232 arranged at the end of the housing channel 402. The second holes 232 may be through the back cover 230. The at least one second holes 232 may be configured as a single second hole or may be configured as a plurality of second holes, and may be arranged in a single line, a plurality of lines or any other arrangement which promotes flow of air through the second channel 204 and the housing channel 402. The second holes 232 may allow air drawn in through the opening 214 in the second channel 204 to exit the cage 200 via the housing channel 402. The housing channel 402 in combination with diverter 410 may be configured to direct air towards or through at least one of the second holes 232.

According to some embodiments, there may be a plurality of third holes 222 through the cage 200 arranged along the housing channel 402. The third holes 222 may be arranged in a line extending in the first direction. The third holes 222 are not limited to an arrangement along a line, and may be arranged in a plurality of lines or any other arrangement which promotes flow of air through the second channel 204, the housing channel 402, or otherwise through the cage 200. The third holes 222 may allow air drawn in through the opening 214 in the second channel 204 to exit the cage 200 via the housing channel 402. The housing channel 402 in combination with diverter 410 may be configured to direct air towards or through at least one of the third holes 222.

According to some embodiments, the first channel 202 and third channel 206 may be bounded by surfaces of cage 200, such as sidewalls 210c. In some embodiments, there is one or more fourth hole 224 through a surface of cage 200 bounding the first or third channel. One or more fourth holes 224 may be adjacent each of the first channel and the third channel. The fourth holes 224 may be arranged in one or more lines extending in the first direction. A portion of a plurality of fourth holes 224 may be arranged along the first channel 202 in two lines extending in the first direction, and another portion of the plurality of fourth holes may be arranged along the third channel 206 in a line extending in the first direction. The fourth holes 224 are not limited to an arrangement along such lines, and may be disposed in any arrangement which promotes flow of air through the first channel 202, the second channel 204, and/or the third channel 206 or otherwise promotes airflow through cage 200. The fourth holes 224 may allow air drawn into the first channel or the third channel through openings 211d in the internal partitions 210d, or drawn into the first or third channels through other openings to exit cage 200 via the first or third channels.

The first holes 220, second holes 232, third holes 222, and fourth holes 224 may allow some amount of electromagnetic radiation to pass through the cage. The first, second, third, and fourth holes may be arranged in patterns such that the amount of electromagnetic radiation that passes through the holes does not interfere with the function of the cage to limit EMI. For example, holes 220 may have a larger area than holes 222 and 224, because holes 220 are adjacent the second channel where there are no components generating or susceptible to EMI.

Other components may be included to more efficiently remove heat generated inside cage 200. An internal heat sink 240 may be disposed within the second channel 204, as shown for example in FIG. 3. In embodiments in which an internal heat sink 240 is disposed within the second channel 204, it may contact a transceiver or other component installed within the first channel 202 or otherwise be coupled to that component through a path of low thermal resistance. Heat transferred to internal heat sink 240 may be at last partially dissipated by air flowing through the opening 214 of the second channel 204 towards the diverter 410. As diverter 410, and/or other components as described herein, improves the airflow through second channel 204, the effectiveness of internal heat sink 240 at limiting a temperature rise within a component in the first channel is improved.

Internal heat sink 240 may alternatively or additional be coupled to a component within the third channel. However, in the embodiment illustrated, an external heat sink 600 (FIG. 6) may dissipate heat from a component in a third channel. Cage 200 and the components within it, may be configured to preferentially remove heat from the first channel so as to equalize the amount of heat removed from the first and third channels. For example, transceivers operating in the first and third channels may experience a temperature rise that is within 25% of each other, in some embodiments. In other embodiments, the temperature rise may be within 10%, 15% or 20% of each other.

According to some embodiments, the fan 130 may be positioned to cause air to flow over or through the cage 200. For example, fan 130 may be positioned to exhaust air from enclosure 120. FIG. 1 shows fan 130 schematically adjacent a wall of enclosure 120, but fan 130 may be positioned in any suitable location. Fan 130, for example, may be positioned inside enclosure 120. In some embodiments, such as in rack mounted electronic devices, 110 connectors are exposed in a front face of the enclosure 120, and one or more fans exhaust air from an opposite, rear face of the enclosure. However, it will be appreciated that other suitable locations may create a pressure drop that causes air to flow over components within an electronic enclosure.

A configuration of a diverter 410 as described herein may enable sufficient airflow to dissipate heat from the transceivers in the first and/or third channels to keep even a relatively dense transceiver configuration within tolerable temperature limits. That airflow may be possible without a large fan, which might draw undesirable amounts of power. In various embodiments, the fan may be configured to cause a static pressure less than 0.8 inches of water (1W), less than 1.5 IW, or, in some embodiments, between 0.8 and 1.5 IW, for example 1.0 IW.

Such a system may provide a desirable method of operation for an electronic system 100. The electronic system 100 may be disposed in an ambient environment of 25 degrees C. The electronic system 100 may include an enclosure 120 and within the enclosure 120, a cage 200. The cage 200 may include a stacked first channel 202, second channel 204, and third channel 206. The first channel 202 may be formed along a first direction. The channels may be formed from a plurality of walls.

The method according to the embodiment includes transmitting and/or receiving optical signals with a transceiver disposed within the first channel 202, and/or transmitting and/or receiving optical signals with a transceiver disposed within the third channel 206. In some embodiments the transceivers in each of the first channel 202 and the third channel 206 may consume at least 1 W, less than 15 W, or, in some embodiments, between 1 and 15 W or between 10 and 15 W or between 14 and 16 W. In some embodiments, the transceivers may consume 1.5 W, 3.5 W, 7 W, 8W, 10 W, 12 W, 14 W, or greater than 14 W. Such power dissipation is consistent with a QSFP-DD transceiver.

The method according to the embodiment includes flowing air through an opening 214 at a first end of the second channel 204 with a fan 130 disposed within the enclosure 120, and diverting the air with a first surface of the diverter, towards openings in walls of the cage. The fan 120 may be operating at a static pressure of at least 0.8 inches of water (IW), less than 1.5 IW, or between 0.8 and 1.5 IW, for example, 1.0 IW. Heat is dissipated from the transceivers in the first channel 202 and/or the third channel 206 such that a temperature rise of both transceivers relative to an off state of the transceivers is less than 25 degrees C. With such a configuration, the heat dissipated from within the cage may be sufficient that this temperature rise may be achieved even with the electronic enclosure in an ambient environment of 25 degrees C. The temperature rise of the transceiver in the first channel 202 relative to an off state of the transceiver may be, for example, 24.7 degrees C. The temperature rise of the transceiver in the third channel 206 relative to an off state of the transceiver may be, for example 20.0 degrees C.

Figure 7:
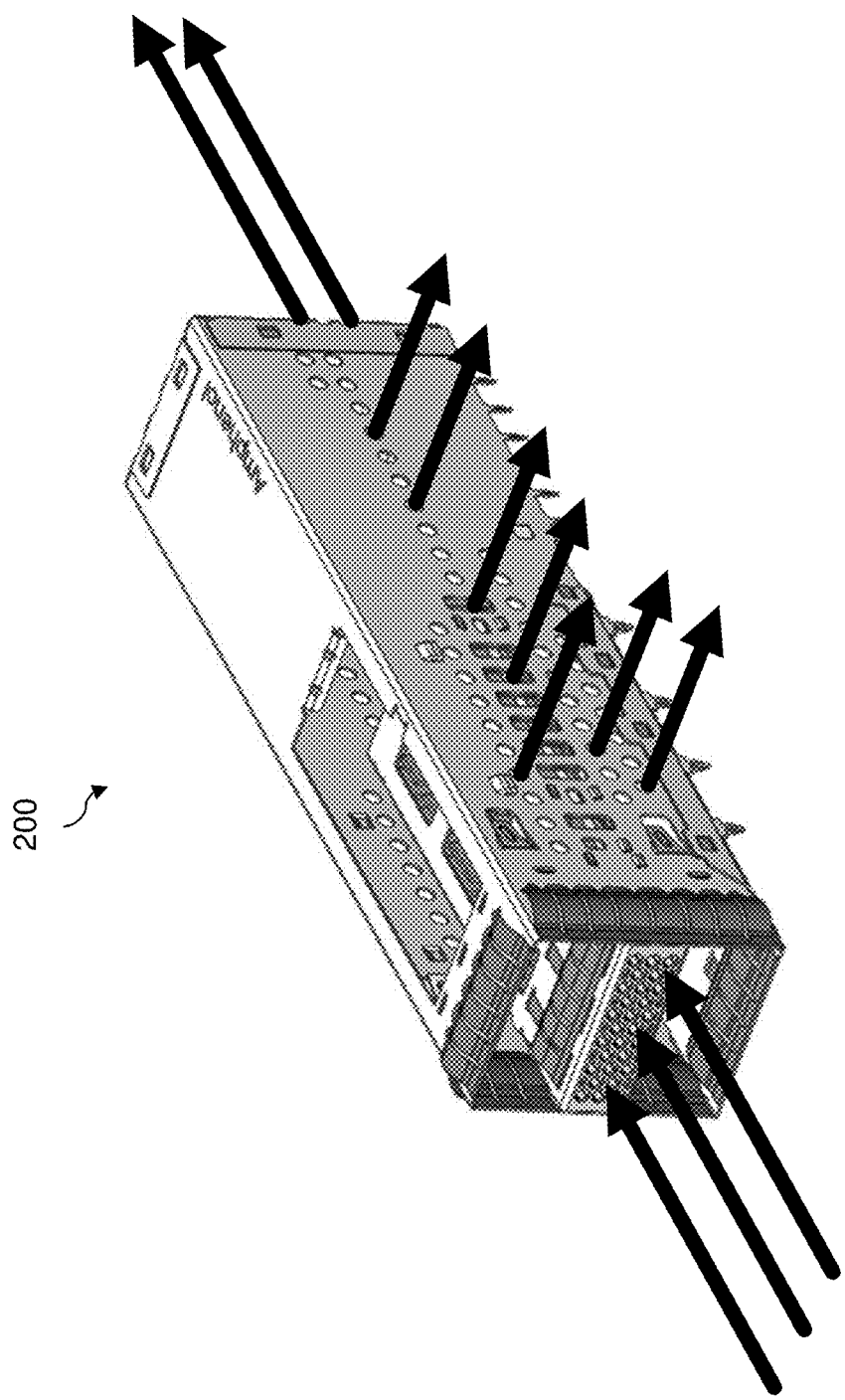
FIG. 7 is a front-right perspective view of a cage for an electrical connector, annotated to show airflow, according to some embodiments.

FIG. 7 shows the cage 200 of FIG. 2. For simplicity, the labels from FIG. 2 are not reproduced in FIG. 7. FIG. 7 includes arrows showing example paths of air flow into and out of the cage 200. The arrows provide exemplary and non-limiting directions of air flow; air may flow into and out of the openings and holes along any appropriate directions. For example, air flow may enter the cage 200 through opening 214 of the second channel 204. Air flow may exit the cage in multiple locations, for example, first holes 220, second holes 222, third holes 232, and/or fourth holes 224. Air is not limited to entering solely through opening 214 and is not limited to exiting solely through the first holes 220, second holes 222, third holes 232, or fourth holes 224. Air may also pass through the openings 211*d* of the internal partitions 210*d*. Air may not necessarily enter through opening 214 and exit through holes 220, 222, 232, and 224. Air may enter and exit the cage 200 at least partially dependent on the arrangement of fan 130 relative to the cage and other components.

In one exemplary embodiment, the system is disposed in an ambient environment of 25 degrees C. The cage is formed from sheet metal bent into a suitable shape. The cage includes a stacked first, second and third channel, the second channel being between the first and third channel, and the first channel is adjacent the circuit board. The first and third channel are each configured to receive a QSFP transceiver. Each transceiver in the first and third channels consumes 12 W of power. The first, second, and third channels have a width which is 18.75 mm. The first channel is separate from the third channel by a distance that is measured including the internal partitions forming the second channel; the distance is 6.48 mm. The second channel has a length of 50 mm. A connector includes a first port aligned with the first channel, and a second port aligned with the third channel. The first channel extends along a first direction from the opening of the first channel to the first port. The second channel and third channel each extend along the first direction. The connector includes a housing, the housing including a diverter aligned with the second channel. The diverter includes a first surface forming an angle, which may be approximately 120 degrees, with the first direction, a second surface forming an angle, which also may be approximately 120 degrees, with the first direction, and a third surface normal to the first direction between the first and second surfaces. The second channel is bounded by a surface, which is also the sidewall of the cage. The sidewall includes a plurality of first holes arranged along the second channel, extending in a line along the first direction, as well as a plurality of fourth holes arranged in 3 lines extending in the first direction, two lines adjacent the first channel, and one line adjacent the third channel. The housing includes a housing channel extending in the first direction. The cage further includes at least one second hole through a back cover of the cage, disposed at the end of the housing channel, and a plurality of third holes through the sidewall of the cage, arranged along the housing channel, along a line extending in the first direction. The diverter and the first, second, and third surfaces of the diverter are configured to direct air towards or through the first, second, and third holes. The fan is disposed within the enclosure and configured to operate at a static pressure of 1.0 IW. There is a heat sink mounted to the top surface of the cage, and an internal heat sink disposed within the second channel. The temperature rise of the transceiver in the first channel relative to an off state of the transceiver is 24.7 degrees C. The temperature rise of the transceiver in the third channel relative to an off state of the transceiver is 20.0 degrees C.

It should be understood that aspects of the disclosure are described herein with reference to certain illustrative embodiments and the figures. The illustrative embodiments described herein are not necessarily intended to show all aspects of the disclosure, but rather are used to describe a few illustrative embodiments. Thus, aspects of the disclosure are not intended to be construed narrowly in view of the illustrative embodiments. In addition, it should be understood that aspects of the disclosure may be used alone or in any suitable combination with other aspects of the disclosure.

For purposes of this patent application and any patent issuing thereon, the indefinite articles "a" and "an," as used herein in the specification and in the claims, unless clearly indicated to the contrary, should be understood to mean "at least one." The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified.

The use of "including," "comprising," "having," "containing," "involving," and/or variations thereof herein, is meant to encompass the items listed thereafter and equivalents thereof as well as additional items.

It should also be understood that, unless clearly indicated to the contrary, in any methods claimed herein that include more than one step or act, the order of the steps or acts of the method is not necessarily limited to the order in which the steps or acts of the method are recited.

The foregoing description of various embodiments are intended merely to be illustrative thereof and that other embodiments, modifications, and equivalents are within the scope of the invention recited in the claims appended hereto.

As one example, diverter 410 as illustrated in FIG. 4 is symmetrical with respect to the center of the second channel through which air is flowing. In embodiments in which a connector and cage assembly is mounted in a system such that air flow adjacent one side of the cage is more restricted than with respect to an opposite side, it may be desirable for a diverter to be asymmetrical. An asymmetrical diverter may preferentially divert air flow to a side of a cage where airflow is less restricted. An asymmetrical diverter may be formed, for example, by having only a first surface 412 or only a first surface 412 and a second surface 414. Such a configuration may be useful for a cage in which connectors are ganged side-by-side.

In the illustrated embodiments, the surfaces are shown as flat. It should be appreciated that an angled surface may be created by multiple small steps that follow the contour of a flat surface having a desired angle. As yet another variation, the surface may be curved having a tangent with a greater angle or lesser with respect to the first direction across the surface but the surface may in the aggregate follow the contour of a surface with a desired angle to shape airflow and may be said to make that angle with respect to the airflow.

As another example, embodiments are described in which connections between a transceiver and a connector are electrical. Embodiments are possible in which the connections are optical.

As another example, an I/O connector is illustrated in which conductive elements are formed into subassemblies that extend perpendicularly to a surface of a PCB to which the connector is mounted. In such a configuration each subassembly may contain conductive elements with mating contact portions that line an upper and lower wall of one or more ports. In other embodiments, conductive elements may be grouped into subassemblies such that the mating contact portions within each subassembly line all or a portion of one wall of one port.

Further, all of the subassemblies are illustrated as having the same configuration. That configuration is not required by the invention. In some alternative embodiments, different styles of subassemblies may be alternated, such as to facilitate a high performance or high density connector. Alternate wafers, for example, may have intermediate portions of the conductive elements offset relative to one another so as to reduce crosstalk.

As yet another example, all or portions of the conductive elements within each subassembly or in different types of subassemblies may be made with different widths. Wider conductive elements may be designated for connection to ground.

What is claimed is:

1. An I/O connector comprising:
   a plurality of conductive elements comprising mating contact portions;
   a housing comprising:
      a first port comprising a first slot extending into the housing in a first direction and elongated in a second direction and, wherein the first slot is bounded by opposing first and second walls extending in the first direction, and mating contact portions of a first portion of the plurality of conductive elements are exposed within the first slot;
      a second port comprising a second slot extending into the housing in the first direction and elongated in the second direction, wherein the second slot is bounded by opposing first and second walls extending in the first direction, and mating contact portions of a second portion of the plurality of conductive elements are exposed within the second slot;
      a surface between the first port and the second port, wherein the surface forms an obtuse angle with respect to the first direction.

2. The I/O connector of claim 1, wherein:
   the surface is a first surface; and
   the housing comprises a second surface between the first port and the second port, wherein the second surface forms an obtuse angle with respect to the first direction.

3. The I/O connector of claim 2, wherein:
   the first surface and the second surface converge toward a plane extending in the first direction and bisecting a central portion of the housing.

4. The I/O connector of claim 1, wherein:
   the housing further comprises a channel extending in the first direction.

5. The I/O connector of claim 1 wherein:
   the first port and the second port extend from the surface, in a direction opposite to the first direction.

6. The I/O connector of claim 1, wherein:
   the second direction is perpendicular to the first direction, and
   the first and second slots are spaced apart in a third direction perpendicular to both the first direction and the second direction.

7. The I/O connector of claim 1, wherein at least one of the first port or the second port is configured to receive a QSFP transceiver.

8. Apparatus comprising:
   a cage comprising:
      opposing conductive sidewalls and a top wall between the opposing sidewalls;
      a first channel comprising a first opening configured to receive a transceiver;
      a second channel adjacent the first channel, the second channel comprising at least one second opening configured to enable air to flow into the second channel; and
   a connector comprising a port aligned with the first channel, the connector comprising a housing;
   wherein:
      the first channel extends in a first direction from the first opening to the port of the connector;
      the second channel extends in the first direction; and
      the housing comprises a diverter aligned with the second channel, wherein the diverter is configured to divert air flowing in the first direction towards at least one sidewall of the cage.

9. The apparatus of claim 8, wherein the diverter comprises a first surface making an obtuse angle with respect to the first direction and a second surface normal to the first direction.

10. The apparatus of claim 9, wherein the diverter further comprises a third surface making an obtuse angle with respect to the first direction.

11. The apparatus of claim 8, wherein:
    the second channel further comprises a surface not normal to the first direction, wherein the surface comprises at least one first hole therethrough; and
    at least one first hole is disposed adjacent, along a second direction normal to the first direction, to the diverter.

12. The apparatus of claim 8, wherein:
    the housing further comprises a housing channel extending in the first direction; and
    the cage further comprises a second hole therethrough disposed at an end of the housing channel.

13. The apparatus of claim 8, wherein:
    the housing further comprises a housing channel extending in the first direction; and
    the cage further comprises a plurality of third holes therethrough arranged along the housing channel, in a line extending in the first direction.

14. The apparatus of claim 8, wherein
    the cage further comprises a third channel comprising a third opening configured to receive a second transceiver;
    the second channel is between the first channel and the third channel; and
    the first channel and the third channel are each configured to receive a QSFP transceiver.

15. An electronic system comprising:
    an enclosure having a panel with at least one opening therethrough;
    a printed circuit board within the enclosure;
    a cage mounted to the printed circuit board; and,
    at least one fan positioned to cause air to flow over the cage,
    wherein:
       the cage comprises a first channel, a second channel and a third channel having ends exposed in the opening;
       the second channel is between the first channel and the third channel;
       the second channel is elongated along a first direction;
       a first end of the second channel comprises at least one opening configured to allow air to flow therethrough;
       the second channel comprises a second end, offset from the first end in the first direction; and the electronic system further comprises a diverter disposed at the second end of the second channel, the diverter comprising a first surface not normal to the first direction.

16. The electronic system of claim 15, wherein the diverter further comprises a second surface not normal to the first direction.

17. The electronic system of claim 15, wherein:
the second channel further comprises sidewalls extending in the first direction, wherein the sidewalls comprise at least one first hole therethrough; and
at least one first hole is disposed adjacent, along a second direction normal to the first direction, to the diverter.

18. The electronic system of claim 15, wherein:
the housing further comprises a housing channel arranged along the first direction; and
the cage further comprises at least one second hole therethrough disposed at an end of the housing channel.

19. The electronic system of claim 15, wherein:
the housing further comprises a housing channel arranged along the first direction; and
the cage further comprises a plurality of third holes therethrough arranged along the housing channel, in a line extending in the first direction.

20. The electronic system of claim 15, wherein the first channel and the third channel are each configured to receive a QSFP transceiver.

21. A method of operating an electronic system comprising, within an enclosure, a stacked cage comprising a plurality of walls configured to form stacked first, second and third channels, the second channel extending in a first direction, and a diverter, the method comprising:
transmitting or receiving optical signals with a transceiver disposed within each of the first and third channels consuming between 10 and 12 W;
flowing air through an opening at a first end of the second channel with a fan operating at a static pressure between 0.8 and 1.5 IW and diverting the air with a first surface of the diverter, towards openings in walls of the cage, thereby dissipating heat from the transceivers in the first and third channels such that, when in an ambient environment of 25 degrees C., a temperature rise of both transceivers relative to an off state of the transceivers is less than 25 degrees C.

22. The method of claim 21, further comprising flowing air over a heat sink mounted outside the cage.

23. The method of claim 21, wherein:
the cage is mounted to a printed circuit board with the first channel adjacent the printed circuit board and the second channel between the first channel and the third channel; and
the first channel is separated from the third channel by 8 mm or less.

24. The method of claim 21, wherein the transceivers in the first and third channels are QSFP-DD transceivers.

25. The method of claim 21, wherein:
the second channel further comprises a surface not normal to the first direction, wherein the surface comprises at least one first hole therethrough, and
diverting air with a first surface of the diverter further comprises directing air towards at least one first hole.

26. The method of claim 21, wherein:
the housing further comprises a housing channel arranged along the first direction and the cage further comprises at least one second hole therethrough disposed at an end of the housing channel, and
diverting air with a first surface of the diverter further comprises diverting air into the housing channel and directing air towards at least one second hole.

27. The method of claim 21, wherein:
the housing further comprises a housing channel arranged along the first direction and the cage further comprises a plurality of third holes therethrough arranged along the housing channel, in a line parallel to the housing channel, and
diverting air with a first surface of the diverter further comprises diverting air into the housing channel and directing air towards at least one third hole.

* * * * *